US010538860B2

(12) United States Patent
Maldonado et al.

(10) Patent No.: US 10,538,860 B2
(45) Date of Patent: Jan. 21, 2020

(54) DEVICES AND METHODS FOR ELECTROCHEMICAL LIQUID PHASE EPITAXY

(71) Applicant: The Regents of The University of Michigan, Ann Arbor, MI (US)

(72) Inventors: Stephen Maldonado, Ann Arbor, MI (US); Joshua DeMuth, Ann Arbor, MI (US); Eli Fahrenkrug, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 15/865,432

(22) Filed: Jan. 9, 2018

(65) Prior Publication Data
US 2018/0195203 A1 Jul. 12, 2018

Related U.S. Application Data

(60) Provisional application No. 62/444,083, filed on Jan. 9, 2017.

(51) Int. Cl.
*C30B 19/12* (2006.01)
*H01L 21/28* (2006.01)
(Continued)

(52) U.S. Cl.
CPC .............. *C30B 19/12* (2013.01); *C30B 19/06* (2013.01); *C30B 19/103* (2013.01); *C30B 29/04* (2013.01);
(Continued)

(58) Field of Classification Search
CPC ....... C30B 19/06; C30B 19/103; C30B 19/12; C30B 29/04; C30B 29/06; C30B 29/08;
(Continued)

(56) References Cited

U.S. PATENT DOCUMENTS 3,573,967 A   4/1971   Pfann et al.
9,388,498 B2  7/2016   Maldonado et al.
(Continued)

FOREIGN PATENT DOCUMENTS

CN   105609899 A   *   5/2016
WO   2013016215 A2      1/2013

OTHER PUBLICATIONS

Fahrenkrug et al, Acc. Chem. Res. 2015, 48, 1881-1890 (Year: 2015).*

(Continued)

*Primary Examiner* — Hua Qi
(74) *Attorney, Agent, or Firm* — Harness, Dickey & Pierce, P.L.C.

(57) ABSTRACT

Electrochemical liquid phase epitaxy (ec-LPE) processes and devices are provided that can form precipitated epitaxial crystalline films or layers on a substrate. The precipitated films may comprise a semiconductor, such as germanium, silicon, or carbon. Dissolution into, saturation within, and precipitation of the semiconductor from a liquid metal electrode (e.g., Hg pool) near an interface region with a substrate yields a polycrystalline semiconductor material deposited as an epitaxial film. Reactor cells for use in an electrochemical liquid phase epitaxy (ec-LPE) device are also provided that include porous membranes to facilitate formation of the precipitated epitaxial crystalline films.

9 Claims, 7 Drawing Sheets

(51) Int. Cl.
*H01M 4/36* (2006.01)
*H01L 21/02* (2006.01)
*C30B 19/06* (2006.01)
*C30B 19/10* (2006.01)
*C30B 29/04* (2006.01)
*C30B 29/06* (2006.01)
*C30B 29/08* (2006.01)
*C30B 30/02* (2006.01)
*H01M 10/02* (2006.01)
*H01M 8/06* (2016.01)

(52) U.S. Cl.
CPC .............. *C30B 29/06* (2013.01); *C30B 29/08* (2013.01); *C30B 30/02* (2013.01); *H01L 21/02532* (2013.01); *H01L 21/02623* (2013.01); *H01L 21/02628* (2013.01); *H01L 21/28176* (2013.01); *H01M 4/36* (2013.01); *H01M 10/02* (2013.01); *H01M 8/06* (2013.01); *H01M 2300/0002* (2013.01); *H01M 2300/0085* (2013.01)

(58) Field of Classification Search
CPC .............. C30B 30/02; H01L 21/02623; H01L 21/28176; H01M 2300/0002; H01M 4/36; H01M 8/06
See application file for complete search history.

(56) References Cited

U.S. PATENT DOCUMENTS

| 2007/0275160 A1 | 11/2007 | Maldonado et al. |
| 2010/0276297 A1 | 11/2010 | Powell, IV et al. |
| 2013/0122390 A1* | 5/2013 | Blunk ..................... F16J 15/14 429/465 |
| 2014/0050999 A1* | 2/2014 | Tolmachev ......... H01M 8/0656 429/418 |
| 2014/0190837 A1* | 7/2014 | Maldonado ....... H01L 21/02425 205/557 |

OTHER PUBLICATIONS

Carim, Azhar I., et al., "Benchtop Electrochemical Liquid-Liquid-Solid Growth of Nanostructured Crystalline Germanium," J. Am. Chem. Soc., vol. 133, pp. 13292-13295 (2011) (published online Aug. 10, 2011) and Supporting Information (pp. S1-S17).

Chockla, Aaron M., et al., "Colloidal Synthesis of Germanium Nanorods," Chem. Mater., vol. 23, pp. 1964-1970 (Mar. 3, 2011).

Fink, Colin G., et al., "Electrodeposition and Electrowinning of Germanium," Journal of the Electrochemical Society, vol. 95, No. 2, 1949, pp. 80-97.

Flowers, Billy H., Jr., et al., "Atomic layer epitaxy of CdTe using an automated electrochemical thin-layer flow deposition reactor," Journal of Electroanalytical Chemistry, vol. 524-525, 2002, pp. 273-285.

Gobet, J., et al., "Electrodeposition of Silicon from a Nonaqueous Solvent," Journal of the Electrochemical Society, vol. 135, No. 1, 1988, pp. 109-112.

Gu, Junsi, et al., "Template-Free Preparation of Crystalline Ge Nanowire Film Electrodes via an Electrochemical Liquid-Liquid-Solid Process in Water at Ambient Pressure and Temperature for Energy Storage," Nano Letters, vol. 12, pp. 4617-4623 (Aug. 17, 2012) and Supporting Information (11 pages).

Liang, Xuehai, et al., "Growth of Ge Nanofilms Using Electrochemical Atomic Layer Deposition, with a 'Bait-and-Switch' Surface-Limited Reaction," Journal of the American Chemical Society, vol. 133, May 3, 2011, pp. 8199-8204.

International Search Report and Written Opinion of the ISA for PCT/US2012/047666, ISA/KR, Seo-gu, Daejeon, dated Jan. 29, 2013.

\* cited by examiner

DEVICES AND METHODS FOR ELECTROCHEMICAL LIQUID PHASE EPITAXY

CROSS-REFERENCE TO RELATED APPLICATIONS

This application claims the benefit of U.S. Provisional Application No. 62/444,083, filed on Jan. 9, 2017. The entire disclosure of the above application is incorporated herein by reference in its entirety.

GOVERNMENT SUPPORT

This invention was made with government support under DE-AR0000523 awarded by the Department of Energy. The Government has certain rights in the invention.

FIELD

The present disclosure relates to devices and methods for electrochemical liquid-liquid-solid growth of semiconductor materials in an epitaxial film.

BACKGROUND

This section provides background information related to the present disclosure which is not necessarily prior art.

The primary obstacle to the widespread utilization of crystalline covalent inorganic thin film photovoltaics is the high cost of the semiconductor synthesis and processing. Many currently available methods of forming crystalline semiconductors are energy intensive, take long periods for processing, and can be quite expensive. For example, conventional processing methods often involve crystallizing an amorphous semiconductor material, such as an amorphous silicon layer, by heat or laser annealing to generate the desired crystallinity. Further, in certain other methods of forming crystalline semiconductor materials, in order to provide the desired morphology for the crystalline material, complex physical and/or chemical templating agents are used. Hence, methods for forming crystalline semiconductor materials that are faster, less expensive, and less energy intensive, while having streamlined control over morphology would be desirable. Additionally, it would be highly desirable to have devices and methods that provide the ability to form one or more epitaxial layers of the semiconductor material over a substrate.

SUMMARY

This section provides a general summary of the disclosure, and is not a comprehensive disclosure of its full scope or all of its features.

In various aspects, the present disclosure provides devices and methods for electrochemical liquid phase epitaxy (ec-LPE). In one variation, a reactor cell for an electrochemical liquid phase epitaxy (ec-LPE) device comprises a substrate and a liquid metal electrode adjacent to the substrate. An interface region is defined between the substrate and the liquid metal electrode. Further, the liquid metal electrode is in electrical communication with a second electrode having a second opposite polarity from the liquid metal electrode. The reactor cell also comprises a porous membrane disposed on a side of the liquid metal electrode opposite from the substrate. A liquid electrolyte source is disposed adjacent to and in fluid communication with the porous membrane. The liquid electrolyte source comprises a liquid electrolyte. The liquid electrolyte comprises an oxide compound of a semiconductor element. The substrate, liquid metal electrode, and porous membrane are compressed together under pressure. The reactor cell is configured in the presence of an electric potential to form an epitaxial layer of precipitated semiconductor element on the substrate near the interface region.

In one variation, a thickness of the liquid metal electrode is less than an effective pathlength of the semiconductor element in the liquid metal electrode.

In one variation, a thickness of the liquid metal electrode is less than or equal to about 300 micrometers.

In one variation, the porous membrane comprises silicon carbide (SiC).

In one variation, the porous membrane has an average surface pore size of greater than or equal to about 150 nm and less than or equal to about 250 nm.

In one variation, the substrate is crystalline and the epitaxial layer is also crystalline.

In one variation, the reactor cell further comprises at least one port in fluid communication with a liquid metal delivery system that delivers liquid metal to the liquid metal electrode.

In one variation, the porous membrane has edge regions that are hydrophobic and a central region that is hydrophilic to permit fluid communication between the liquid electrolyte and the liquid metal electrode.

In one variation, the reactor cell further comprises a plate disposed between the porous membrane and the substrate. The plate comprises one or more open regions that define the liquid metal electrode.

In one variation, the semiconductor element is selected from the group consisting of: silicon, germanium, carbon, and combinations thereof.

In another aspect, the present disclosure contemplates an electrochemical liquid phase epitaxy (ec-LPE) device. The device comprises a reactor cell. The reactor cell comprises a substrate and a liquid metal electrode adjacent to the substrate. An interface region is defined between the substrate and the liquid metal electrode. The liquid metal electrode is in electrical communication with a second electrode having a second opposite polarity from the liquid metal electrode. A porous membrane is also disposed on a side of the liquid metal electrode opposite from the substrate. The reactor cell further includes a liquid electrolyte source disposed adjacent to and in fluid communication with the porous membrane. The source includes liquid electrolyte that comprises an oxide compound of a semiconductor element. In the presence of an electric potential, the semiconductor element forms an epitaxial layer on the substrate at the interface region. The device further comprises a pair of clamping plates sandwiching the reactor cell. The clamping plates compress the substrate, liquid metal electrode, and porous membrane in the reactor cell together. The device may further include a liquid metal delivery system in fluid communication with the liquid metal electrode in the reactor cell, as well as a source of potential in electrical communication with the liquid metal electrode and the second electrode.

In one variation, the reactor cell further comprises a plate disposed between the porous membrane and the substrate, wherein the plate has one or more open regions that define the liquid metal electrode.

In one variation, a thickness of the liquid metal electrode is less than an effective pathlength of the semiconductor element in the liquid metal electrode.

In one variation, a thickness of the liquid metal electrode is less than or equal to about 300 micrometers.

In one variation, the porous membrane comprises silicon carbide (SiC) and has an average surface pore size of greater than or equal to about 150 nm and less than or equal to about 250 nm.

In one variation, the substrate is crystalline and the epitaxial layer is also crystalline.

In one variation, the porous membrane has edge regions that are hydrophobic and a central region that is hydrophilic to permit fluid communication between the liquid electrolyte and the liquid metal electrode.

In yet other aspects, the present disclosure provides a method for electrochemical liquid phase epitaxial (ec-LPE) semiconductor growth. The method comprises applying an electric potential to a reactor cell. The reactor cell comprises a substrate, a liquid metal electrode adjacent to the substrate, a porous membrane disposed on a side of the liquid metal electrode opposite from the substrate, and a liquid electrolyte source disposed adjacent to and in fluid communication with the porous membrane. The source of liquid electrolyte includes a liquid electrolyte. The liquid electrolyte comprises an oxide compound of a semiconductor element. The applying of the electric potential drives an electrochemical reduction reaction so that the semiconductor element enters the liquid metal electrode where it precipitates out of solution on the substrate as an epitaxial film comprising the semiconductor element.

In one variation, the first liquid metal electrode has a thickness that is less than an effective pathlength of the semiconductor element in the first liquid metal electrode.

In one variation, the method further comprises applying pressure to the reactor cell to compress the substrate, liquid metal electrode, and porous membrane together.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1A-1B. FIG. 1A shows a schematic representing homogenous electrodeposition nucleation within a liquid electrode near an interface between a liquid electrolyte and a liquid electrode showing growth of precipitated cube-shaped semiconductor material from the liquid electrode. FIG. 1B shows a schematic representing heterogeneous nucleation within liquid electrolyte near an interface with a liquid electrolyte showing horizontal growth of an epilayer of a substrate semiconductor material from the liquid electrode in accordance with certain aspects of the present disclosure.

Figure 7A:
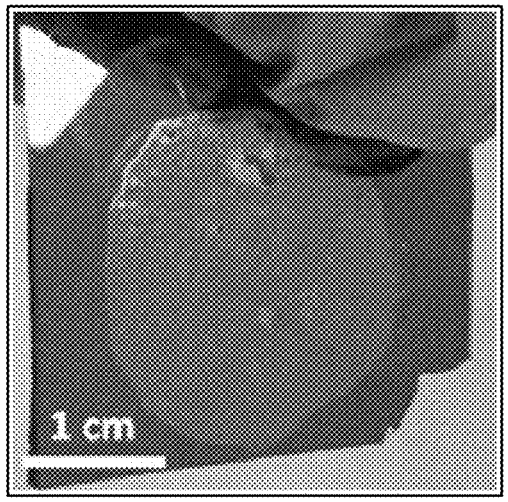
Figure 7B:
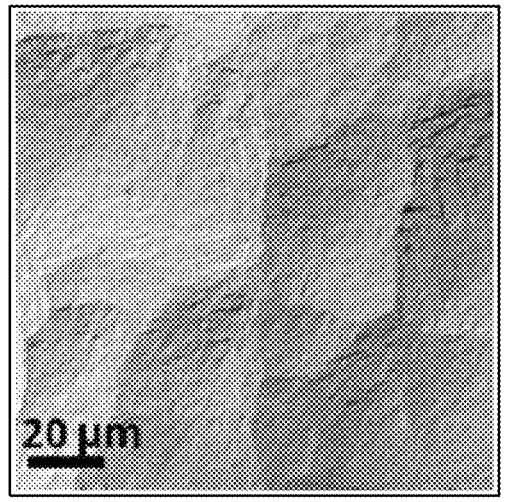
Figure 7C:
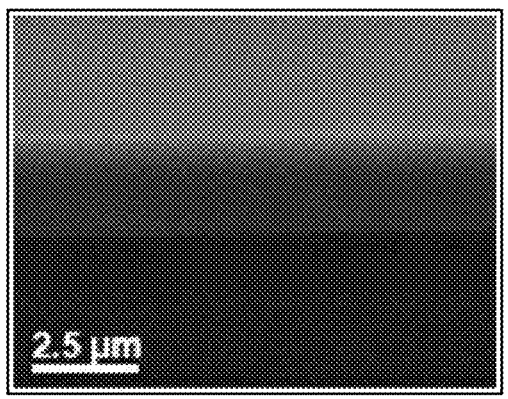
Figure 7D:
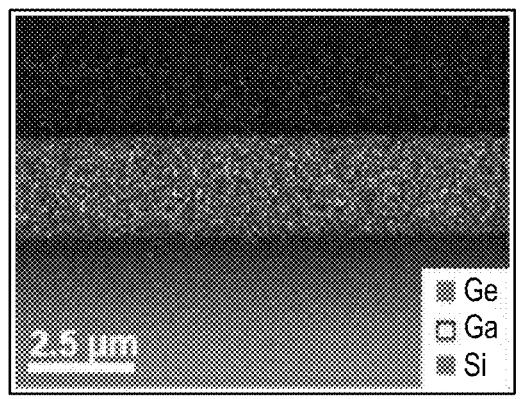

FIGS. 7A-7D. FIG. 7A is a photograph of a germanium (area is about 1 in$^2$) film deposited onto a degenerately doped n-Si wafer substrate by an electrochemical liquid phase epitaxy (ec-LPE) process in accordance with certain aspects of the present disclosure. Scale bar is 1 cm. FIG. 7B shows the surface roughness of the as-deposited films, as identified by laser profilometry. Scale bar is 20 µm. FIG. 7C shows a sectional scanning electron micrograph (SEM) of a cross section of a film like that shown in FIG. 7A after fracturing. Scale bar is 2.5 µm. FIG. 7D shows an elemental map (obtained through energy dispersive X-ray spectroscopy) of an epitaxial germanium (Ge) film deposited on a silicon (Si) substrate superimposed on the electron micrograph. The epitaxial film is deposited by an electrochemical liquid phase epitaxy (ec-LPE) process in accordance with certain aspects of the present disclosure.

Figure 8A:
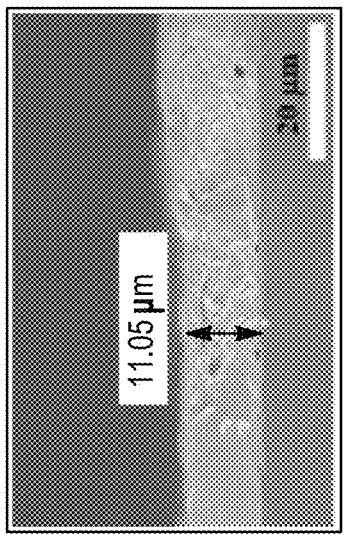
Figure 8B:
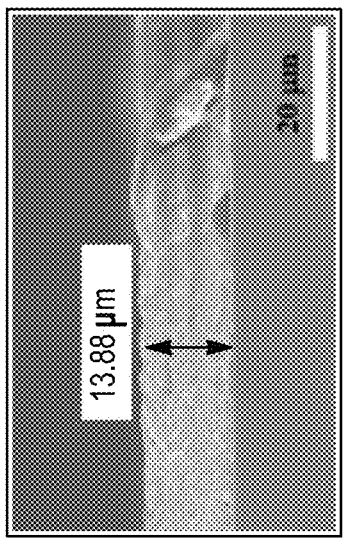
Figure 8C:
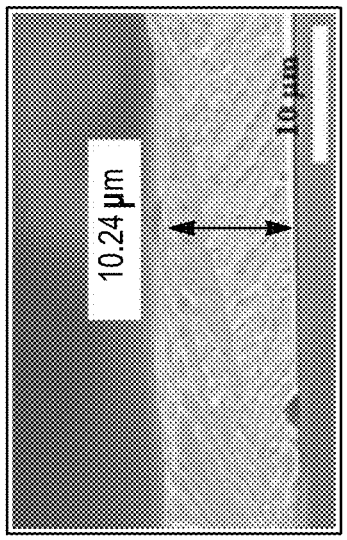

FIGS. 8A-8C. FIGS. 8A-8C show cross-sectional views of a thin (frozen) liquid metal film upon removal from a cell in an electrochemical liquid phase epitaxy (ec-LPE) device according to certain aspects of the present disclosure. These images represent sections near the left edge, center, and right edge of the circular area of the film. FIG. 8A has a measured thickness of about 11.05 µm, FIG. 8B has a measured thickness of about 13.88 µm, and FIG. 8C has a measured thickness of about 10.24 µm. Scale bars are 20 µm in FIGS. 8A-8B and 10 µm in FIG. 8C.

Figure 9A:
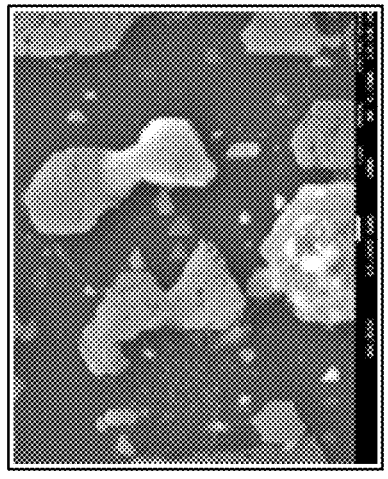
Figure 9B:
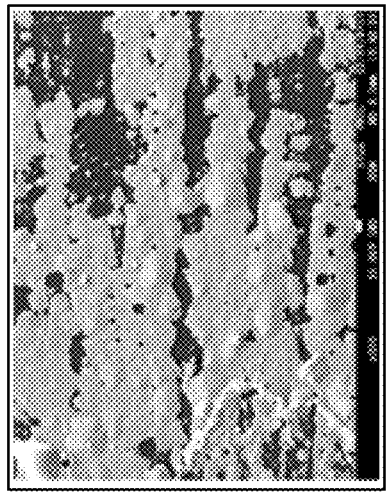
Figure 9C:
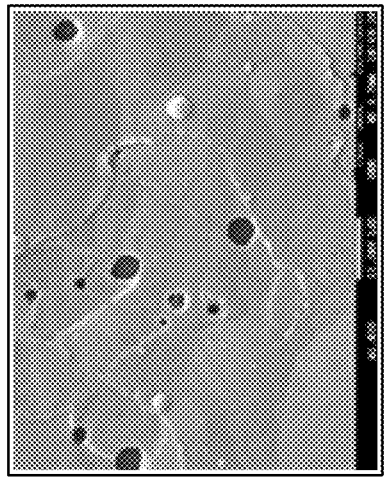

FIGS. 9A-9C. FIGS. 9A-9C show scanning electron micrograph (SEM) images of germanium (Ge) films deposited on an underlying silicon (Si) substrate at short (FIG. 9A), intermediate (FIG. 9B), and long deposition times (FIG. 9C).

Figure 10D:
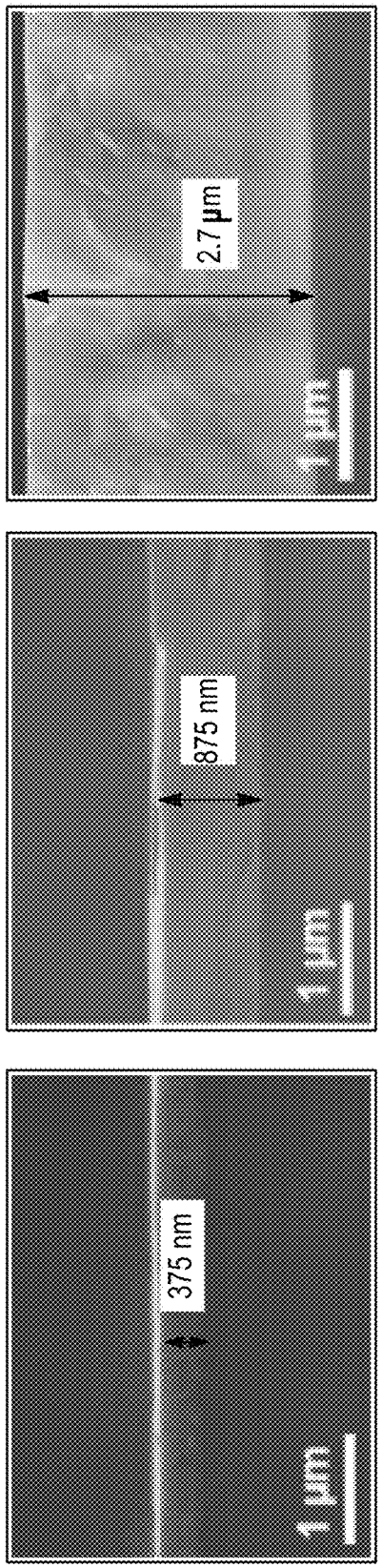
Figure 10D:
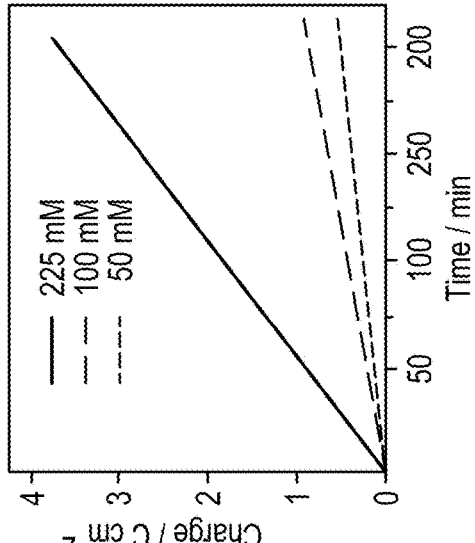
Figure 10E:
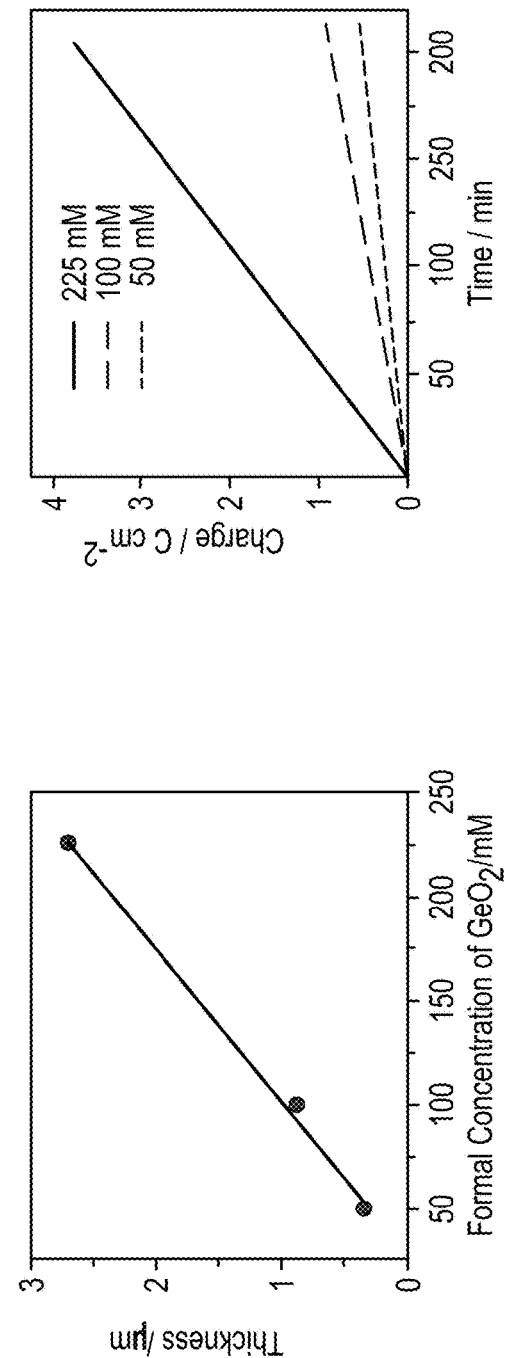

FIGS. 10A-10E. FIGS. 10A-10C show sectional scanning electron micrograph (SEM) views from germanium-containing (Ge) films formed at different concentrations of a germanium precursor (germanium oxide ($GeO_2$)) after an electrochemical liquid phase epitaxy (ec-LPE) process conducted for about 3.5 hours at a temperature of about 90° C. FIG. 10A is a film formed with a concentration of about 50 mM having a thickness of about 375 nm, FIG. 10B is a film formed with a concentration of about 100 mM having a thickness of about 875 nm, and FIG. 10C is a film formed with a concentration of about 225 mM having a thickness of about 2.7 µm. Scale bars are 1 µm. FIG. 10D shows a chart of film thickness (nm) versus concentration of germanium precursor (germanium oxide ($GeO_2$), where the fitted line is y=13.569x−377.82 and where $R^2$ is 0.99. Finally, FIG. 10E shows a chart of charge density ($C \cdot cm^2$) versus time (minutes) for the three concentrations of germanium precursor (germanium oxide ($GeO_2$) at 50 mM, 100 mM, and 225 mM.

Figure 11D:
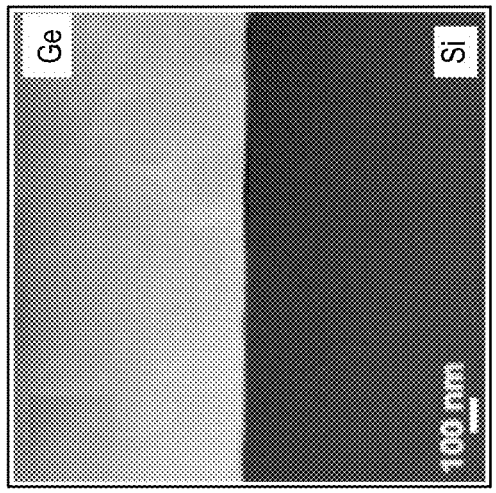
Figure 11B:
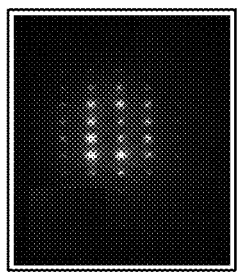
Figure 11C:
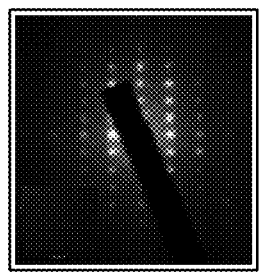
Figure 11E:
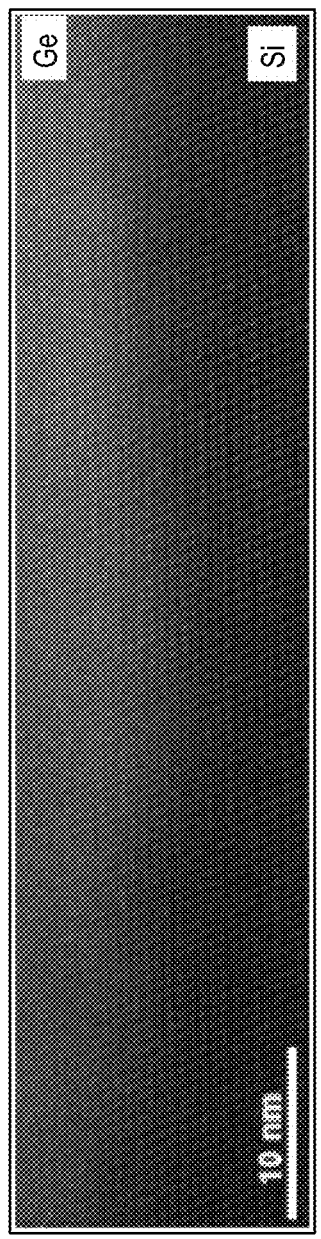
Figure 11A:
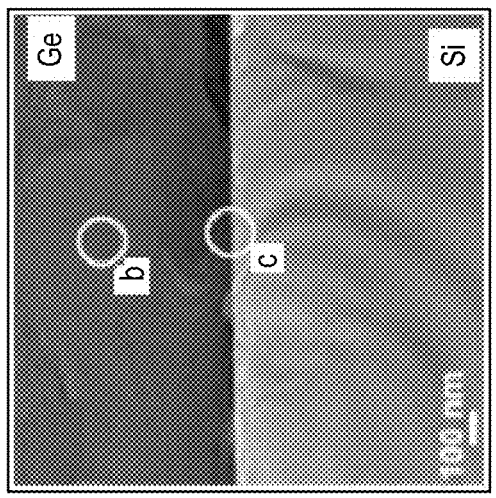

FIGS. 11A-11E. FIG. 11A shows a bright field transmission electron micrograph of a cross section of an epitaxial germanium (Ge) film prepared by an electrochemical liquid phase epitaxy (ec-LPE) deposition process in accordance with certain aspects of the present disclosure on a degenerately doped crystalline n-Si substrate for 120 minutes. The material with lighter contrast on the bottom is silicon (Si)

and the material with the darker contrast on top is germanium (Ge) prepared by ec-LPE. The circled regions in FIG. 11A show the regions where electron diffraction patterns are collected. FIGS. 11B and 11C show the electron diffraction patterns for the respective regions in FIG. 11A. Notably, the diffraction patterns show the Ge and Si materials are single crystalline and in registry with each other. FIG. 11D shows a dark field transmission electron micrograph of a cross section of an epitaxial Ge film prepared by an electrochemical liquid phase epitaxy (ec-LPE) process on a degenerately doped crystalline n-Si substrate in accordance with certain aspects of the present disclosure. The contrast in each material indicates each material is single crystalline. FIG. 11E shows a high magnification dark field transmission electron micrograph of the interface between a Si substrate and a Ge film prepared by an electrochemical liquid phase epitaxy (ec-LPE) process in accordance with certain aspects of the present disclosure. No intervening buffer layer is observed.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of" the alternative embodiment excludes any additional compositions, materials, components, elements, features, integers, operations, and/or process steps, while in the case of "consisting essentially of" any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will now be described more fully with reference to the accompanying drawings.

In various aspects, the present disclosure pertains to methods and devices for forming materials that comprise a Group IV element. In certain variations, a semiconductor material may be formed, which may refer to any material that is an insulator at relatively low temperatures, but has an appreciable electrical conductivity at relatively high temperatures, for example, around room temperature. Semiconductors useful in the context of the present teachings optionally comprise elements of Groups III-V of the Periodic Table. In certain aspects, such semiconductor elements may include boron, aluminum, gallium, indium, silicon, germanium, carbon (e.g., diamond), tin, bismuth, antimony, arsenic, phosphorus, nitrogen, alloys and/or compounds thereof. In one aspect, the semiconductor element may be a Group IV element selected from the group consisting of: silicon, germanium, carbon (e.g., diamond), tin, alloys and/or compounds thereof. For example, semiconductor compounds including Group IV semiconductor elements may include SiC and SiGe. Such semiconductor materials find wide applicability in a variety of fields and applications, including those in microelectronics, opto-electronic devices, photovoltaics, energy conversion devices, like electrochemical cells, batteries, thermoelectric devices, and the like, by way of non-limiting example.

In various aspects, scalable, non-energy intensive, and environmentally benign methods are provided for producing crystalline, nanostructured epitaxial semiconductor materials. To this end, the inventive technology provides assembly strategies that do not rely on conventional semiconductor industry multi-step fabrication processes, but instead can yield fully functional nanomaterial-based devices in a single preparative step in a device. Such methods involve electrochemically synthesizing crystalline semiconductor films deposited on a substrate by using liquid electrolytes, such as aqueous or other polar solvents capable of dissolving semiconductor oxides, in combination with a liquid electrode, which may serve as a metallic liquid flux.

The liquid metal electrode can act as a traditional electrode platform for electrodeposition, as well as a solvent for crystallization. By such principles, the semiconductor can be initially electrodeposited as a fully reduced material, which is then dissolved within the electrode now acting as a liquid flux. If the electrodeposition continues, the alloy eventually reaches saturation, followed by crystalline semiconductor precipitation out of the electrode acting as a liquid flux. The crystallinity and morphology of the deposit is related to the rates of electroreduction, dissolution, crystal nucleation, and precipitation. In certain aspects, the precipitation of the semiconductor material occurs on a substrate adjacent to the electrode. The inventive techniques are also referred to as an electrochemical liquid phase epitaxy (ec-LPE) for growing semiconductor epitaxial films.

Figure 1A:
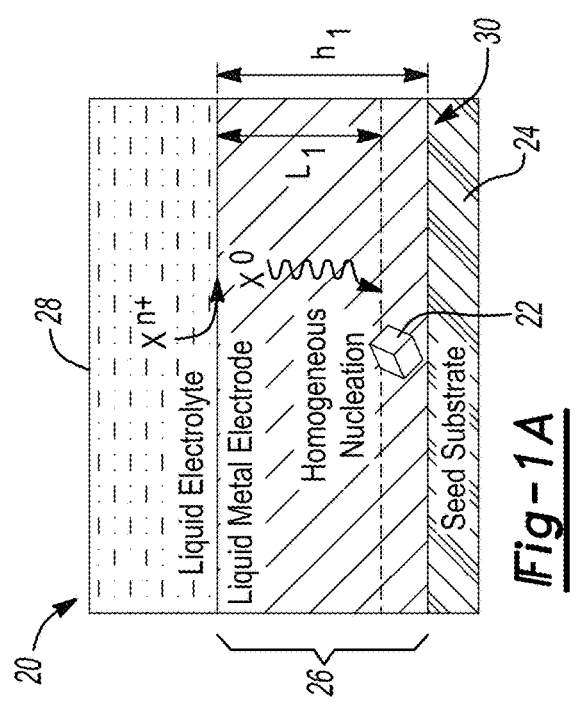
Figure 1B:
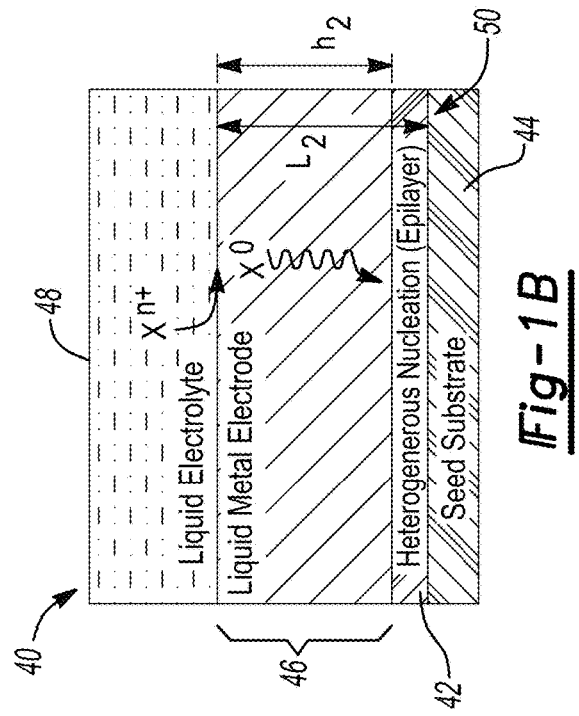

As shown in FIGS. 1A and 1B, two distinct electrodeposition conditions are shown. FIG. 1A shows a first liquid-liquid-solid electrodeposition system 20 that results in homogenous electrodeposition of a precipitated semiconductor material 22. FIG. 1B shows a second liquid-liquid-solid electrodeposition system 40 that results in heterogeneous electrodeposition of a precipitated epitaxial layer or film 42 of semiconductor material on a seed substrate 44. In FIG. 1A, a seed substrate 24 is adjacent to a liquid metal electrode 26. A liquid electrolyte 28 is disposed adjacent to the liquid metal electrode 26. Likewise, in FIG. 1B, the seed substrate 44 is adjacent to a liquid metal electrode 46. A liquid electrolyte 48 is disposed adjacent to the liquid metal electrode 46.

In FIG. 1A, a thickness "$h_1$" of the liquid metal electrode 26 film is thicker than an effective pathlength ($L_1$) that a dissolved solute can travel through the liquid metal electrode 26, before undergoing a homogeneous nucleation event to form a cubic precipitated semiconductor material 22 that is independent and freestanding of the seed substrate 24. In this manner, the prospects for epitaxial growth of a deposited semiconductor film at an interface 30 of the liquid metal electrode 26 and the seed substrate 24 are minimal.

In FIG. 1B, a thickness "$h_2$" of the liquid metal electrode 46 film is less than an effective pathlength ($L_2$) that a dissolved solute can travel through the liquid metal electrode 46, before undergoing a heterogeneous nucleation event. As such, where a thickness $h_2$ of the liquid metal electrode 46 film is less than or equal to $L_2$, then epitaxial deposition of the precipitated epitaxial layer or film 42 of semiconductor material at an interface 50 of the liquid metal electrode 46 and the seed substrate 44 are likely to occur.

Thus, in certain aspects, the present disclosure provides a novel process combining the principles of electrodeposition and epitaxial crystal growth from liquid metals referred to as electrochemical liquid phase epitaxy (ec-LPE). Through ec-LPE, crystalline semiconductor films can be grown that require only simple process equipment, non-flammable precursors, and low temperatures (temperatures of less than or equal to about 150° C.). One aspect of the electrochemical liquid phase epitaxy methods and devices is the formation of thin liquid metal films that act as electrodes in contact with liquid electrolytes to promote epitaxial heterogeneous deposition of continuous planar films on a substrate, rather than homogenous nucleation/precipitation independent of the substrate. Thus, as discussed below, the low melting point liquid metal films have thicknesses within specific ranges, where the upper bound of the thickness is less than an effective pathlength of a dissolved solute in the liquid metal, while the lower bound on the thickness is determined to be the electrocapillarity of the liquid metal and the ability to infiltrate small channels uniformly.

In certain variations, the present disclosure provides devices having a specialized membrane assembly that facilitates formation of a thin film liquid metal electrode having a predetermined thickness that promotes formation of a planar continuous precipitated semiconductor thin film on the substrate. Formation of films on a seed substrate without the use of such a membrane assembly under pressure in the devices discussed below poses significant challenges, as the precipitated material can locally roll onto itself causing balling or localized three-dimensional structure formation.

Hence, in certain aspects, the present disclosure provides a method for forming a planar thin film or layer of material that comprises a semiconductor element by first contacting a liquid electrolyte with a first electrode. The liquid electrolyte may be an aqueous electrolyte comprising water and/or may contain another polar solvent capable of dissolving a semiconductor oxide. The first electrode is in electrical communication with a second electrode having a second opposite polarity from the first electrode, so that an electrolytic process is conducted. Electrochemical devices having an oxidizable active anode material, a reducible cathode material, and a liquid electrolytic solution between and in contact with the anode and the cathode are well known for conducting electrochemical processes. Often, such electrochemical processes and devices have half-reactions or half-cells separating the first electrode (either anode or cathode) and a first electrolyte from the second electrode (the other of the cathode and anode) and a second electrolyte. In certain variations, it is contemplated that the material comprising a semiconductor element is formed in a half-cell via a half-reaction, coupled with the complementary other half-cell/reaction.

An aqueous liquid electrolyte can be formed by combining water and a precursor of the semiconductor element. A precursor may include an oxide compound of a semiconductor element. In certain variations, the semiconductor element forming the oxide may be a Group IV semiconductor element or any of the others discussed previously above. In certain other aspects, the semiconductor element is more specifically selected from the group consisting of: silicon, germanium, carbon, and combinations thereof. An aqueous liquid electrolyte may comprise water and the at least one oxide compound of the semiconductor element. In some variations, a liquid electrolyte capable of dissolving the oxide of a semiconductor element can be employed, which comprises one or more polar solvents (aside from water). The one or more polar solvents capable of dissolving a semiconductor oxide may optionally comprise dimethyl sulfoxide, dimethylformamide, acetone, acetonitrile, combinations and equivalents thereof, by way of non-limiting example. These polar solvents may be combined with water to form the electrolyte, as well. In certain embodiments, the oxide compound can be germanium oxide ($GeO_2$) and/or silicon dioxide ($SiO_2$) in aqueous solution (or stabilized by surfactants).

In certain variations, the liquid electrolyte is in the form of a solution, including water, optionally one or more polar solvents in addition to or in lieu of water, and one or more oxide compounds. A "solution" as used herein encompasses not only solutions having components (e.g., phases, moieties, solvents, solutes, molecules, and the like) that are dissolved and homogenously mixed together, but also combinations of components or materials that are not necessarily dissolved or evenly, homogeneously, or regularly distributed when combined (e.g., unevenly mixed combinations of components, separated layers of immiscible components, unevenly distributed suspensions, and the like). However, in certain preferred aspects, the liquid electrolyte is in the form of a traditional solution having solutes, such as the oxides of the semiconductor element(s), dissolved within the aqueous or polar solvent. It should be appreciated that the electrolyte may further comprise other typical additives for an electrolyte system, as are well known in the art, including without limitation buffers. Exemplary buffers include sodium borate ($Na_2B_4O_7$) and/or potassium bicarbonate ($KHCO_3$) used at conventional concentrations, which can be readily determined by those of skill in the art. The composition of the buffer(s) does not appear to have any effect on the electrochemical reactions or product formed.

The methods of the present teachings may, in various aspects, include generating a precipitated solid material comprising the semiconductor element in the form of a film or planar layer deposited on a substrate. The precipitated solid material can be generated by applying an electric potential to the first electrode (e.g., a cathode) in contact with the liquid electrolyte to drive an electrochemical reduction reaction that forms a solid material comprising the semiconductor element by precipitating the semiconductor element out of solution within (inside) the first electrode (at an interface between the substrate and the first electrode). The first electrode may define a thin metal layer disposed between the substrate and the liquid electrolyte. The first electrode may have a thickness that is less than or equal to an effective pathlength of the solute. As such, where the thickness of the liquid metal electrode film is less than or equal to the effective pathlength of the solute, epitaxial deposition of the precipitated epitaxial layer or film of semiconductor material occurs at the interface on the substrate. While the predetermined thickness of the liquid metal electrode may thus vary based on the composition and solutes involved, generally, the thickness of the liquid metal electrode may be less than or equal to about 20 micrometers, optionally less than or equal to about 19 micrometers, optionally less than or equal to about 18 micrometers, optionally less than or equal to about 17 micrometers less than or equal to about 16 micrometers, optionally less than or equal to about 15 micrometers, optionally less than or equal to about 14 micrometers, optionally less than or equal to about 13 micrometers, optionally less than or equal to about 12 micrometers, optionally less than or equal to about 11 micrometers, less than or equal to about 10 micrometers, optionally less than or equal to about 9 micrometers, less than or equal to about 8 micrometers, optionally less than or equal to about 7 micrometers, optionally less than or equal to about 6 micrometers, optionally less than or equal to about 5 micrometers, optionally less than or equal to about 4 micrometers, optionally less than or equal to about 3 micrometers, optionally less than or equal to about 2 micrometers, optionally less than or equal to about 1 micrometer, optionally less than or equal to about 900 nanometers, optionally less than or equal to about 800 nanometers, optionally less than or equal to about 700 nanometers, optionally less than or equal to about 600 nanometers, and in certain variations, optionally less than or equal to about 500 nanometers. Furthermore, as will be described below, in certain variations, electrode materials are in a liquid form at the temperatures at which the electrochemical process takes place, for example, less than or equal to about 100° C.

In various aspects, the first electrode comprises a material that is inactive with respect to any parasitic electrochemical reactions in the presence of the semiconductor element in the electrolyte (e.g., avoids parasitic electrolyte decomposition electrochemical reactions, like hydrogen generation in an aqueous electrolyte), so that the electrochemical reduction reaction that forms the solid material comprising the semiconductor element occurs preferentially instead. In certain aspects, the first electrode material is selected so as to have a non-zero solubility with respect to the semiconductor element, so that under high current densities used for the electroreduction reaction of the semiconductor element, the semiconductor element fluxes into a bulk of the first electrode material, but remains near and saturates near a surface region/interface between the first electrode and the underlying substrate.

Accordingly, in certain variations, the first electrode comprises a material that is conductive, in a liquid phase at temperatures of less than or equal to about 150° C., can be formed into a thin film, and has non-zero solubility for the species that will be precipitated out within the electrode to form the precipitated material. In certain variations, the first electrode comprises one or more Group II or Group III metals from the Periodic Table. In some variations, the first electrode comprises a metal selected from the group consisting of: gallium, mercury, indium, bismuth, zinc, cadmium, combinations and alloys thereof. In certain preferred variations, the first electrode comprises mercury, gallium, indium, bismuth, or combinations or alloys thereof. In certain particularly advantageous variations, the first electrode comprises gallium or mercury. In certain variations, the first electrode may comprise gallium (Ga), gallium indium (GaIn), bismuth indium (BiIn), and the like.

Substrates may be formed of a material that is conductive under the conditions of deposition. In certain aspects, the substrate may be a crystalline material, including single-crystalline substrates composed of a single-crystalline solid material or polycrystalline substrates composed of a polycrystalline solid material. The crystallinity of the substrate may serve as a seed layer or template that promotes crystallinity during epitaxial deposition of the precipitated material deposited thereon, so as to form a crystalline precipitated material. By way of non-limiting example, the substrate may including glass with a conductive coating, silicon (Si), for example, a crystalline (100) Si silicon substrate or a crystalline (111) silicon substrate, and gallium arsenide (GaAs), for example a crystalline (100) GaAs substrate, by way of non-limiting example.

The methods of the present teachings may form a crystalline deposited material. For example, the method may comprise contacting a liquid electrolyte, such as an aqueous electrolyte, with a first liquid electrode. The first electrode is in liquid form and is in electrical communication with a second electrode having a second opposite polarity from the first electrode. In certain variations, the liquid electrolyte may be formed by combining water and an oxide compound comprising a semiconductor element to form an aqueous electrolyte, while the first liquid electrode comprises a metal selected from the group consisting of: mercury, gallium, indium, bismuth, zinc, cadmium, combinations and alloys thereof. In alternative variations, the electrolyte may be formed by combining one or more polar solvents with an oxide compound comprising a semiconductor element (where the one or more polar solvents are capable of dissolving the oxide compound). A crystalline material comprising the semiconductor element is generated by such a method by applying an electric potential to the first liquid electrode in contact with the electrolyte to drive an electrochemical reduction reaction that generates the crystalline material comprising the semiconductor element by precipitation within the first liquid electrode at an interface with a substrate. Thus, in one variation, the methods of the present disclosure are capable of producing unlimited amounts of crystalline solid germanium (Ge(s)) from electrolyte solutions comprising an oxide of germanium (GeO$_2$(aq)).

In certain aspects, the generating occurs by creating a flux of the semiconductor elements into the first liquid electrode when applying the electric potential from the first (and second) electrode. For example, as shown in FIG. 1B, the semiconductor species to be deposited in the precursor is shown as X$^{n+}$, which migrates from the liquid electrolyte 48 into the liquid metal electrode 46. The semiconductor element concentration thus increases inside the first electrode (e.g., liquid metal electrode 46 in FIG. 1B), where it is dissolved in the first electrode material. Such a process of "dissolving" may include the mixing of two phases with the formation of one new homogeneous phase or solution, or may also include a solvation process, where any stabilizing interaction of a solute or solute moiety and the solvent (or a similar interaction of solvent with groups of an insoluble material) occurs.

Applying an electric potential to the first electrode in contact with the electrolyte drives an electrochemical reduction reaction. Thus, after dissolution or solvation of the semiconductor element X into the first electrode material, the semiconductor species is reduced to a neutral uncharged state X$^0$. In certain aspects, the first electrode material may be saturated with the semiconductor element. This saturation causes heterogeneous precipitation of a solid layer or film of the semiconductor element from the first electrode onto the substrate, thus forming an epitaxial precipitated layer on the substrate. Furthermore, the methods of the present disclosure provide the ability to form semiconductor materials, like crystalline solid germanium (Ge(s)) having tunable nano-structured shapes or morphologies.

Thus, in various aspects, a rate of generating the solid precipitated semiconductor film is determined by controlling a magnitude of the applied electric potential between the first electrode and the second electrode. For example, in certain embodiments, the applied electric potential is greater than or equal to about the formal potential of the semiconductor reduction half reaction (−0.9 V vs. Ag/AgCl at pH=8.5 for Ge in water) to less than or equal to about an overpotential of 2 V. In this manner, a rate of generating of the material comprising the semiconductor element can be quite high, for example, greater than or equal to about 1×10$^{-9}$ mol cm$^{-2}$ s$^{-1}$. In certain variations, a rate of generating of the precipitated solid material comprising the semiconductor element is greater than or equal to about 1×10$^{-12}$ mol cm$^{-2}$ s$^{-1}$.

In various aspects, the methods of the present teachings provide the capability to generate a precipitated solid material comprising the semiconductor element at ambient temperatures without any need for heat treatment for annealing. In certain aspects, the generating may be conducted at greater than or equal to room temperature (e.g., approximately 20-25° C.) to less than or equal to about 150° C., optionally at greater than or equal to room temperature (e.g., approximately 20-25° C.) to less than or equal to about 100° C.

Furthermore, the methods of forming such precipitated material may also include the ability to control morphology of the material by controlling the nature and magnitude of the applied electric potential applied to generate a polycrystalline material. In certain variations, the crystalline material comprising a semiconductor material is in the form of an epitaxial film or layer deposited on a substrate. The films are substantially conformal to the substrate and can provide full continuous coverage of the substrate. Such a film or layer structure naturally has a major surface defined by an x-axis and a y-axis in an x-y plane, but also has a thickness in a z-axis direction. In certain aspects, the film or layer may be considered to be two-dimensional, although films or layers with greater thicknesses can also be formed.

The deposited film may have a thickness of less than or equal to about 3 micrometers, optionally less than or equal to about 2 micrometers, less than or equal to about 1 micrometer, optionally less than or equal to about 900 nanometers, optionally less than or equal to about 800 nanometers, optionally less than or equal to about 700 nanometers, optionally less than or equal to about 600 nanometers, optionally less than or equal to about 500 nanometers, optionally less than or equal to about 400 nanometers, optionally less than or equal to about 300 nanometers, optionally less than or equal to about 100 nanometers, and in certain variations, optionally less than or equal to about 100 nanometers. Desirably, the epitaxial film has a substantially uniform thickness across the entire film, for example, varying less than or equal to about 25% in thickness, optionally varying less than or equal to about 15% in thickness, and in certain variations, varying less than or equal to about 10% in thickness over the entire film area. It should be noted that the epitaxial film is desirably coherent and continuous on the substrate, without holes or uncoated islands. As noted above, prior to the development of the present electrochemical liquid phase epitaxy (ec-LPE) processes, formation of such continuous epitaxial films along a surface of a substrate material posed certain challenges, including difficulty in preventing materials from rolling up or balling away from the substrate surface.

Advantageously, such methods provide the capability to form crystalline materials, such as polycrystalline or alternatively single crystal materials. Thus, in certain aspects, the crystalline material formed via such methods is a polycrystalline material. In yet other aspects, the crystalline material is a single crystal material. A "crystallized" material, as used herein, means the arrangement of atoms, ions, molecules and/or macromolecules into an ordered structure containing a three-dimensional periodic and repeating array of atoms, ions, or molecules and optionally contains at least one repeatable unit cell. In certain variations, the solid precipitated materials may comprise a single crystal (not having distinct grains with grain boundaries). In other aspects, such solid precipitated materials may comprise a plurality of distinct grains having grain boundaries, which are thus polycrystalline. In certain aspects, the present methods provide a randomly oriented crystallized structure (having a plurality of crystalline domains with random orientations). In certain variations, an average crystal domain size may be greater than or equal to about 10 nanometers to less than or equal to about 500 micrometers.

In one variation, electrochemical liquid phase epitaxy (ec-LPE) processes are used to generate a new epitaxial semiconductor thin film. A novel process thus combines the principles of electrodeposition and epitaxial crystal growth from liquid metals for the electrochemical liquid phase epitaxy (ec-LPE) process. The ec-LPE processes can grow crystalline semiconductor films that require only simple process equipment, non-flammable precursors, and low temperatures (T≤about 150° C.). As discussed above, the ability to form heterogeneous precipitated epitaxial films is related to an ability to not only control a thickness of the liquid electrode during deposition, but also to ensure that the film does not pull away from the substrate surface to ball up or form three-dimensional structures. It has been discovered that certain porous membranes provide such an ability during a electrochemical liquid phase epitaxy (ec-LPE) deposition process.

Figure 2:
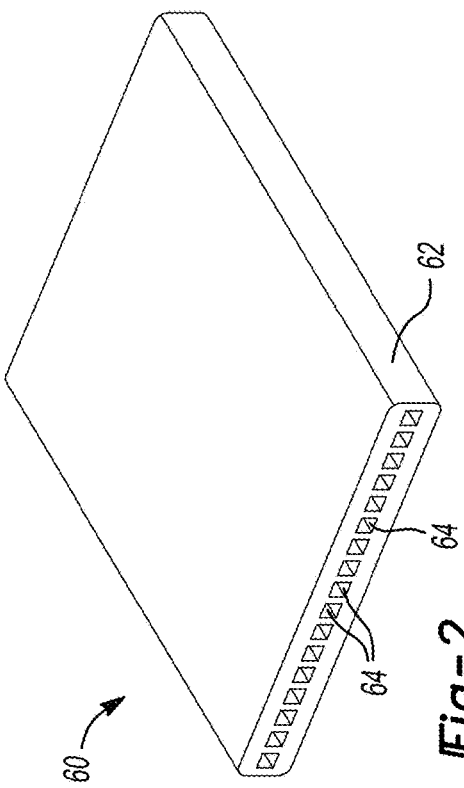
FIG. 2 shows a porous membrane formed of silicon carbide (SiC) to be incorporated into a device for electrochemical epitaxial semiconductor growth in accordance with certain aspects of the present disclosure.
Figure 3:
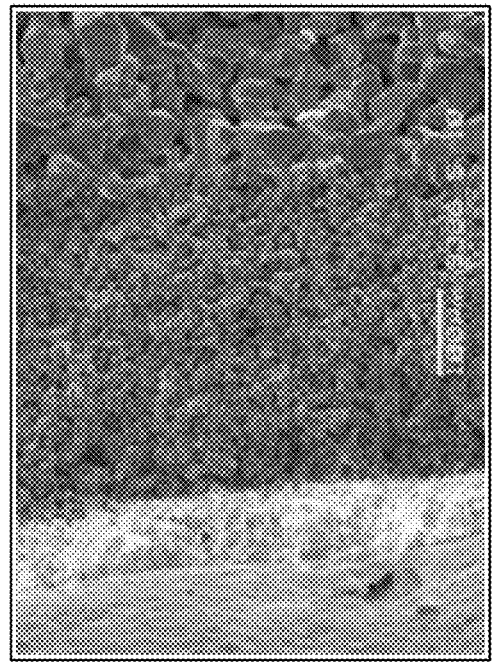
FIG. 3 shows a scanning electron micrograph (SEM) image of the porous membrane like that shown in FIG. 3. Scale bar is 100 µm.

FIG. 2 shows such a porous membrane 60 that can be incorporated into a device for electrochemical epitaxial semiconductor growth in accordance with certain aspects of the present disclosure. The porous membrane 60 is formed from a porous material body 62 that further defines optional parallel flow channels 64 formed in the porous material body 62. The porous membrane 60 is formed at least in part from a ceramic silicon carbide (SiC) material, which has a hierarchical pore structure. A SiC membrane can be formed on walls of a porous ceramic structure by slipcasting ceramic particles onto the surface, followed by drying and sintering to form the silicon carbide along the surface. In certain variations, an average surface pore size (e.g., diameter) may be greater than or equal to about 100 nm and less than or equal to about 300 nm, optionally greater than or equal to about 150 nm and less than or equal to about 250 nm, and in one variation, about 200 nm as shown in FIG. 3. The porous material body 62 permits fluid flow there through, advantageously flow of a liquid metal. Such a material is available as flat sheets from LiqTech International A/S (commercial product is FSM), which can withstand a maximum temperature up to about 800° C., a maximum pressure up to about 3 bar, any pH, and a liquid flux of 3,000 L per hour at 1 bar (water). As described further herein in the context of FIG. 5, such a membrane is further treated so that select regions have a different hydrophilicity/hydrophobicity than the remainder of the membrane. For example, the porous membrane may be treated with a polydimethyl siloxane (PDMS) to impart hydrophobicity in select regions. One example of a suitable PDMS is available from Dow Corning as a two-part PDMS SYLGARD™ 184 (dynamic viscosity of about 3,500 centipoise at application conditions).

Figure 4:
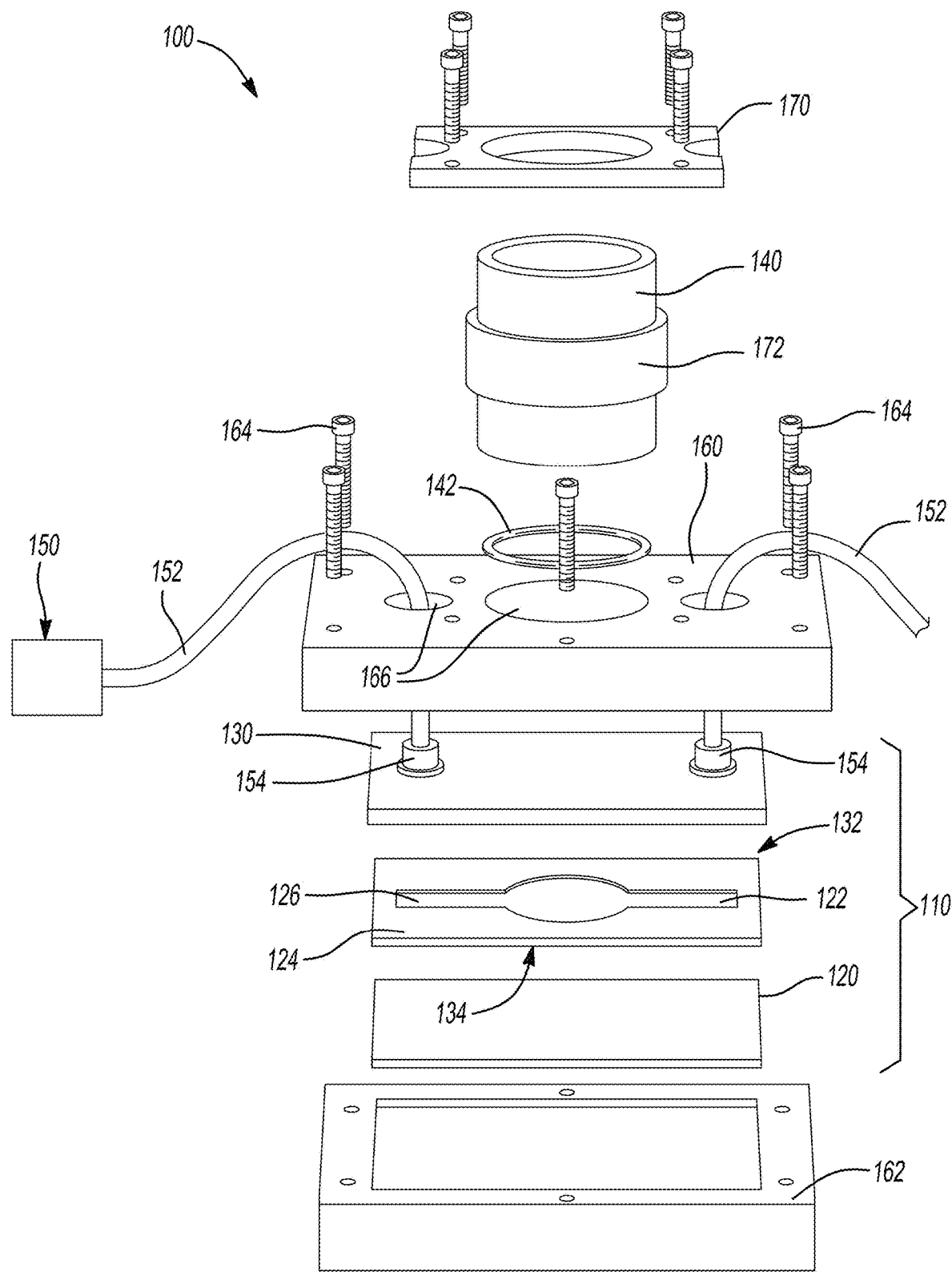
FIG. 4 shows an exploded view of components within an exemplary electrochemical liquid phase epitaxy (ec-LPE) device for electrochemical epitaxial semiconductor growth in accordance with certain aspects of the present disclosure.
Figure 5:
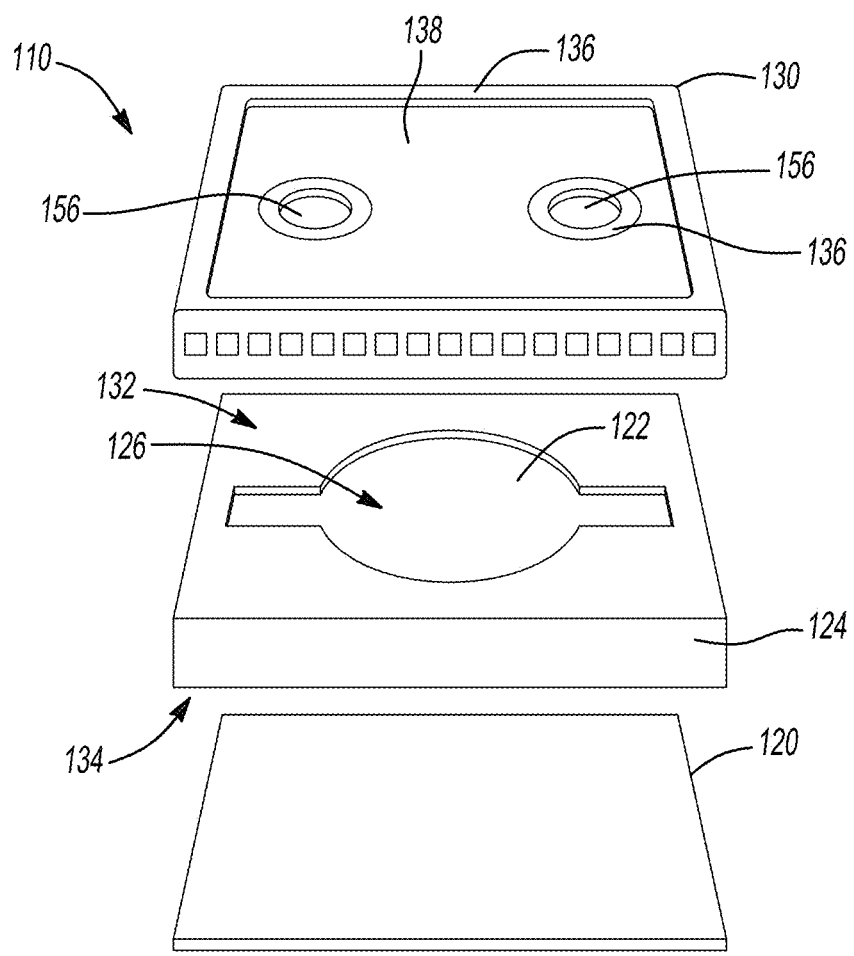
FIG. 5 shows an exploded view of a membrane component, a plate with select regions that define a liquid metal electrode, and a substrate for use in an exemplary electrochemical liquid phase epitaxy (ec-LPE) device in accordance with certain aspects of the present disclosure.

FIG. 4 shows an example of an electrochemical liquid phase epitaxy (ec-LPE) device 100 for electrochemical epitaxial semiconductor growth in accordance with certain aspects of the present disclosure. The ec-LPE device 100 includes a reactor cell 110, which is also shown in FIG. 5. The reactor cell 110 includes a substrate 120. A liquid metal electrode 122 is disposed adjacent to the substrate 120. As shown in FIGS. 4 and 5, the reactor cell 110 includes a plate 124 that has one or more open regions 126 that define a channel for receiving liquid metal and therefore define the liquid metal electrode 122.

A porous membrane 130 is disposed on a side 132 of the liquid metal electrode 122 opposite from the substrate 120. An interface region 134 is defined between the substrate 120 and the liquid metal electrode 122. As shown in FIG. 5, the porous membrane 130 has select regions 136 that are treated to exhibit hydrophobic properties, while other remaining regions 138 of the porous membrane 130 are hydrophilic. Thus, as shown, the select regions 136 treated to be hydrophobic include edges 139 and regions around ports 154.

Therefore, as shown in FIG. 4, the ec-LPE device 100 includes a liquid electrolyte source or cell 140 that can retain liquid electrolyte (not shown). Gaskets or O-ring seals 142 can be included near junctions with the liquid electrolyte cell 140 to prevent electrolyte fluid from leaking. The liquid electrolyte can comprise a precursor or oxide compound of a semiconductor element, as discussed above. The liquid electrolyte cell 140 is disposed above the porous membrane 130. The remaining regions 138 of the porous membrane that are hydrophilic permit fluid communication through between the liquid electrolyte and the liquid metal electrode 122 through the porous membrane 130, while the select regions 136 that are hydrophobic minimize or prevent fluid flow, especially flow of liquid electrolyte therethrough. In this manner, the porous membrane 130 controls the flow pattern of the liquid electrolyte. Further, the porous membrane 130 has good porosity and provides good flow of electrolyte, while maintaining a desired thickness or height of the liquid metal electrode 122 to facilitate formation via precipitation of an epitaxial film onto the substrate 120 at the interface region 134. The presence of the porous membrane 130 in the reactor cell 110 also helps to prevent the epitaxial film from rolling off or balling away from the substrate 120.

The device 100 also includes a liquid metal delivery system 150 that is in fluid communication with the liquid metal electrode 122 and thus can circulate a liquid metal into and/or out of the liquid metal electrode 122. As shown, the liquid metal delivery system 150 includes two fluid conduits 152 in fluid communication with the liquid metal electrode 122 in the reactor cell 110. The fluid conduits 152 may be tubing, pipes, and the like. The fluid conduits 152 are connected to two ports 154 that can serve as inlets/outlets from the liquid metal electrode 122. The ports 154 include open apertures 156 (shown in FIG. 5) formed in the porous membrane 130. In this manner, liquid metal can be delivered to and/or removed from the liquid metal electrode 122 via the fluid conduits 152 that are part of the liquid metal delivery system 150. It should be noted that the number and configuration of conduits 152, ports 154, and the like are merely representative and non-limiting.

A pair of clamping plates, upper clamp plate 160 and lower clamp plate 162, sandwich the reactor cell 110. The upper clamp plate 160 and lower clamp plate 162 can be secured via screws 164 or other retaining mechanisms that can apply compressive pressure to the components in the reactor cell 110. Thus, the pair of clamping plates 160, 162 compress the substrate 120, liquid metal electrode 122 (and optional plate 124), and porous membrane 130 in the reactor cell 110 together to bring them into tight contact with one another. The amount of compressive force may be greater than or equal to about 40 pounds per square inch. The upper clamp plate 160 includes several distinct openings 166 to receive the electrolyte cell 140 and/or fluid conduits 152 from the liquid metal delivery system 150.

A cell retaining plate 170 can be slid over the electrolyte cell 140 to secure and retain it within the ec-LPE device 100. Notably, the electrolyte cell 140 includes a flange 172 against which the cell retaining plate 170 can seat when the components in the ec-LPE device 100 are assembled. While not shown, the electrolyte cell 140 may be in fluid communication with a separate electrolyte delivery system.

The liquid metal electrode 122 is in electrical communication with a second electrode having a second opposite polarity from the liquid metal electrode 122. In certain aspects, the substrate 120 may be electrically conductive and thus serve as the electrical contact to the liquid metal or it may be an insulating, independent component incorporated into the ec-LPE device 100. In the latter case, the liquid metal is contacted separately within/near liquid metal delivery system 150. The electrodes may have electrical connectors and/or terminals that are in electrical communication with an external source of potential (not shown). In this manner, electric potential can be applied to the reactor cell 110 to drive the electrochemical reduction reaction so that the semiconductor element exits the electrolyte and enters the liquid metal electrode 122, where it precipitates out of solution on the substrate 120 as an epitaxial film comprising the semiconductor element, as described above in the context of FIG. 1B. The ec-LPE electrodeposition process can be performed either with a constant applied electrochemical potential or a constant current demand.

While not shown, the ec-LPE device 100 may include other conventional components, such as a heater. The operating temperature can be monitored continuously with a thermocouple. Additional traditional components used for electrodeposition may be used in conjunction with the ec-LPE device 100. The configuration and design of the ec-LPE device 100 shown in FIG. 4 is merely exemplary and may be modified as recognized by those of skill in the art.

The present disclosure also provides methods for electrochemical liquid phase epitaxial (ec-LPE) semiconductor growth. The method may comprise forming an epitaxial layer on a substrate by contacting a liquid electrolyte with a first liquid electrode adjacent to the substrate. The first liquid electrode is in electrical communication with a second electrode having a second opposite polarity from the first electrode. The liquid electrolyte may be formed by combining water and an oxide compound comprising a semiconductor element. The first liquid electrode comprises a metal, which in certain variations may be selected from the group consisting of: mercury, gallium, indium, zinc, cadmium, combinations and alloys thereof.

The method further includes generating a crystalline epitaxial material layer comprising the semiconductor element on the substrate by applying an electric potential to the first liquid electrode in contact with the electrolyte to drive an electrochemical reduction reaction that generates the crystalline material comprising the semiconductor element by precipitation within the first liquid electrode at an interface region with the substrate. Notably, any of the material compositions described above may be used and/or formed in such a method.

In another variation, the present disclosure contemplates a method for electrochemical liquid phase epitaxial (ec-LPE) semiconductor growth that may comprise applying an electric potential to a reactor cell. The reactor cell may include a substrate, a liquid metal electrode adjacent to the substrate, a porous membrane disposed on a side of the liquid metal electrode opposite from the substrate, and a liquid electrolyte source disposed adjacent to and in fluid communication with the porous membrane. The source comprises a liquid electrolyte. The liquid electrolyte comprises an oxide compound of a semiconductor element. The applying of the electric potential drives an electrochemical reduction reaction so that the semiconductor element enters the liquid metal electrode where it precipitates out of solution on the substrate as an epitaxial film comprising the semiconductor element.

In certain variations, the first liquid metal electrode has a thickness that is less than an effective pathlength of the semiconductor element in the first liquid metal electrode. In other variations, a thickness of the liquid metal electrode is optionally less than or equal to about 300 micrometers. The porous membrane may comprise silicon carbide (SiC). The porous membrane has an average surface pore size of greater than or equal to about 150 nm and less than or equal to about 250 nm. The porous membrane may have edge regions that are hydrophobic and a central region that is hydrophilic to permit fluid communication between the liquid electrolyte and the liquid metal electrode. In certain variations, the substrate is crystalline and the epitaxial layer is also crystalline.

The method may further comprise applying pressure to the reactor cell to compress the substrate, liquid metal electrode, and porous membrane together. During the ec-LPE electrodeposition process, the pressures near the interface region during the process may be greater than or equal to about 1 atmospheres (atm) to greater to than or equal to about 1.1 atm. The temperatures near the interface region during the process may be greater than or equal to about 20° C. to less than or equal to about 500° C., or the boiling point of the solvent, whichever is lower.

The ec-LPE electrodeposition process can be performed either with a constant applied electrochemical potential or a constant current demand.

In other aspects, the method may further comprise delivering liquid metal to the liquid metal electrode via a liquid metal delivery system. In yet other aspects, the method may further comprise delivering electrolyte to the source of liquid electrolyte via an electrolyte delivery system.

In certain aspects, the epitaxial layer comprising a semiconductor element is crystalline.

In certain aspects, the epitaxial layer comprises silicon and the epitaxial layer is generated by dissolving the silicon into the liquid metal electrode, followed by saturating the liquid metal electrode with the dissolved silicon, and then precipitating the silicon from the liquid metal electrode at the interface region with the substrate.

In certain other aspects, the epitaxial layer comprises germanium and the epitaxial layer is generated by dissolving the germanium into the liquid metal electrode, followed by saturating the liquid metal electrode with the dissolved germanium, and then precipitating the germanium from the liquid metal electrode at the interface region with the substrate.

In yet other aspects, the epitaxial layer comprises carbon and the epitaxial layer is generated by dissolving the carbon into the liquid metal electrode, followed by saturating the liquid metal electrode with the dissolved carbon, and then precipitating the carbon from the liquid metal electrode at the interface region with the substrate.

In other aspects, a rate of generating the precipitated epitaxial layer is determined by magnitude of the applied electric potential. In certain aspects, the rate of generating of the precipitated solid material comprising the semiconductor element is greater than or equal to about $1 \times 10^{-12}$ mol cm$^{-2}$ s$^{-1}$. In certain variations, the applied electric potential is greater than or equal to about a standard potential for the semiconductor reduction process to less than or equal to about 2 V overpotential.

Figure 6:
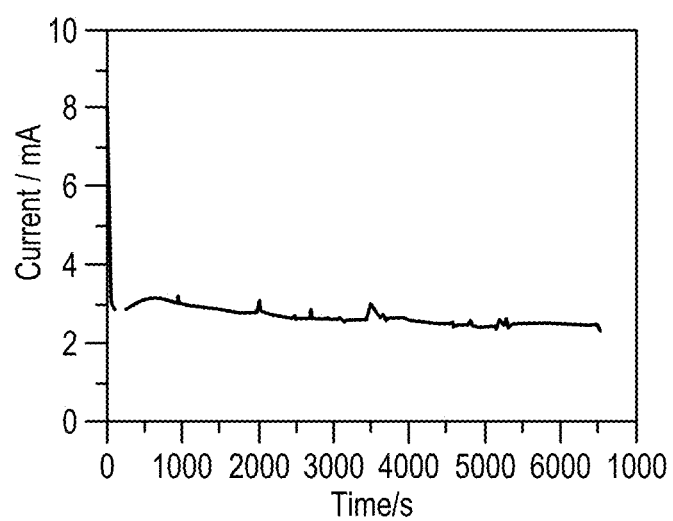
FIG. 6 shows a representative chronoamperometry plot recorded during an electrochemical liquid phase epitaxy (ec-LPE) process of germanium (Ge) at E=−1.6 V versus E(Ag/AgCl) at a temperature of 80° C.

FIG. 6 shows a representative current-time plot recorded during an electrochemical liquid phase epitaxy (ec-LPE) process according to certain aspects of the present disclosure for the reduction of an aqueous solution saturated with dissolved $GeO_2$ at E=−1.6 V vs E(Ag/AgCl) and T=80° C. An epitaxial germanium film is electrochemically deposited on a degenerately doped n-Si(100) substrate. As observed in FIG. 6, the ec-LPE reactor designs show a steady-state condition of introduction of $Ge^0$ into the liquid following the first approximate 2 minutes. The deposition process can be run continuously and indefinitely if the liquid electrolyte reservoir is sufficiently replenished at long times. The steady-state responses in FIG. 6 facilitate analyses of the deposited films at short, intermediate, and long times with reproducibility, as discussed below in the context of FIGS. 9A-9C.

In other aspects, a germanium film is deposited by an electrochemical liquid phase epitaxy (ec-LPE) process in accordance with certain aspects of the present disclosure as shown in FIG. 7A. FIG. 7B shows the topography of the top of the as-deposited Ge film prepared by ec-LPE. FIG. 7C shows a cross sectional scanning electron micrograph (SEM) of a fractured Ge film on the Si substrate. FIG. 7D shows an interface region after an epitaxial film is deposited by an electrochemical liquid phase epitaxy (ec-LPE) process in accordance with certain aspects of the present disclosure, where the interface region is formed between a substrate of silicon (Si) and the as-deposited Ge layer.

In accordance with certain aspects of the present disclosure, methods are contemplated for fabricating large area thin liquid metal films with arbitrary thicknesses. FIGS. 8A-8C illustrate a cross-section of such a thin liquid metal film after removal from a cell in an electrochemical liquid phase epitaxy (ec-LPE) device according to certain aspects of the present disclosure followed by freezing and then cross-sectioning. The film has an area of approximately 1 in$^2$ and is prepared on an optically flat, degenerately doped Si wafer. These images represent sections near the left edge, center, and right edge of the circular area of the film. FIG. 8A has a measured thickness of about 11.05 μm, FIG. 8B has a measured thickness of about 13.88 μm, and FIG. 8C has a measured thickness of about 10.24 μm.

FIGS. 9A-9C present representative top down views of Ge films prepared by an electrochemical liquid phase epitaxy (ec-LPE) process on a (111) silicon substrate in accordance with certain aspects of the present disclosure as in FIG. 6 at various time points. FIG. 9A shows a short deposition time of about 5 minutes, FIG. 9B shows an intermediate deposition time of about 30 minutes, and FIG. 9C shows a long deposition time of about 120 minutes. At short times, the initial stages of Ge nucleation on the Si(111) substrate are apparent in FIG. 9A. In accord with the diamond lattices of both Ge and Si, the Ge nuclei on the (111) surface plane showed epitaxy with the underlying substrate. The salient feature of this point is that it can be achieved under entirely benchtop conditions with an aqueous precursor solution at ambient pressure. At longer times, the nuclei coalesce into a two-dimensional (2D) film, as shown in FIG. 9B. At even longer deposition times, the film is coherent and contiguous. The circular "holes" in the film at long times are artifacts caused by a design of an initial cell design.

Several materials characterizations are employed to assess the nature of the electrodeposited Ge film. For example, electron back-scatter diffraction (EBSD) analyses obtained at several locations on a Ge film prepared by an ec-LPE process shows diagnostic Kikuchi patterns that could be readily indexed to the [111] directions of a diamond lattice. All local probes exhibited the same Kikuchi patterns, indicating epitaxy is achieved throughout the film. A separate X-ray diffraction analyses corroborated this finding. Diffraction patterns acquired over a large area of a Ge film on a Si(111) substrate prepared by ec-LPE methods confirm that the Ge films formed in accordance with certain aspects of the present disclosure are both crystalline and have epitaxial orientation with the substrate over the entire area.

Some preliminary investigations are performed to assess factors that most directly impact the nature of the films prepared by the ec-LPE electrodeposition processes according to certain aspects of the present disclosure. FIGS. 10A-10E summarize one such representative dataset, where the concentration of the Ge precursor in the aqueous electrolyte is varied. Each Ge ec-LPE run is conducted in an otherwise identical fashion (at the same temperature and for the same time). For the data in FIGS. 10A-10E, a galvanostatic (constant current) approach is employed to ensure that IR losses do not account for any differences, because the electrolyte ionic strength is not constant.

FIGS. 10A-10C show sectional scanning electron micrograph (SEM) views from germanium-containing (Ge) films formed at different concentrations of a germanium precursor (germanium oxide ($GeO_2$)) after an electrochemical liquid phase epitaxy (ec-LPE) process conducted for about 3.5 hours at a temperature of about 90° C. FIG. 10A is a film formed with a concentration of about 50 mM having a thickness of about 375 nm, FIG. 10B is a film formed with a concentration of about 100 mM having a thickness of about 875 nm, and FIG. 10C is a film formed with a concentration of about 225 mM having a thickness of about 2.7 μm. As seen in FIGS. 10A-10C, the as-deposited film thicknesses are a strong function of Ge precursor concentration. At higher concentrations, the films are thicker and thus implied that the growth rate is first order with respect to concentration. FIG. 10D shows a chart of film thickness (nm) versus concentration of germanium precursor (germanium oxide ($GeO_2$), where the fitted line is y=13.569x−377.82 and where $R^2$ is 0.99. Finally, FIG. 10E shows a chart of charge density (C·cm$^2$) versus time (minutes) for the three concentrations of germanium precursor (germanium oxide (GeO$_2$) at 50 mM, 100 mM, and 225 mM. Irrespective of the film thickness and concentration used to perform ec-LPE, all films show the characteristic crystalline signature in the X-ray diffraction data that also signifies that epitaxial relationship with the substrate is maintained in all cases.

FIG. 11A shows a bright field transmission electron micrograph of a cross section of an epitaxial Ge film prepared by ec-LPE on a degenerately doped crystalline n-Si substrate for 120 min. The material with lighter contrast on the bottom is Si and the material with the darker contrast on top is Ge prepared by ec-LPE. The circled regions show the regions where electron diffraction patterns were collected. Namely, FIGS. 11B and 11C show the electron diffraction patterns for the respective regions in FIG. 11A. Notably, the diffraction patterns show the Ge and Si materials are single crystalline and in registry with each other. FIG. 11D shows a dark field transmission electron micrograph of a cross section of an epitaxial Ge film prepared by ec-LPE on a degenerately doped crystalline n-Si substrate. The contrast in each material indicates each material is single crystalline. FIG. 11E shows a high magnification dark field transmission electron micrograph of the interface between a Si substrate and a Ge film prepared by ec-LPE. No intervening buffer layer is observed.

In certain variations, coherent and contiguous liquid metal films have been formed in ec-LPE deposition processes in accordance with certain aspects of the present disclosure that have dimensions of 4 inches in diameter on a 6 in wafer support. These films are nominally uniform across the entire substrate. Uniform wetting of the liquid metal on the substrate is an important consideration for larger dimension films, but all other factors are identical as observed in the smaller area films prepared by ec-LPE processes. Thus, the ec-LPE electrodeposition processes according to certain aspects of the present disclosure provide the ability to manufacture covalent, crystalline inorganic semi conductors.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A reactor cell for an electrochemical liquid phase epitaxy (ec-LPE) device, the reactor cell comprising:
   a substrate;
   a liquid metal electrode adjacent to the substrate, wherein an interface region is defined between the substrate and the liquid metal electrode;
   a porous membrane disposed on a side of the liquid metal electrode opposite from the substrate; and
   a liquid electrolyte source disposed adjacent to and in fluid communication with the porous membrane, the source comprising a liquid electrolyte that comprises an oxide compound of a semiconductor element; wherein the substrate, liquid metal electrode, and porous membrane are compressed together under pressure, wherein a thickness of the liquid metal electrode is less than an effective pathlength of the semiconductor element in the liquid metal electrode and the reactor cell is configured in a presence of an electric potential to form an epitaxial planar layer of precipitated semiconductor element on the substrate at the interface region.

2. The reactor cell of claim 1, wherein the thickness of the liquid metal electrode is less than or equal to about 300 micrometers.

3. The reactor cell of claim 1, wherein the porous membrane comprises silicon carbide (SiC).

4. The reactor cell of claim 1, wherein the porous membrane has an average surface pore size of greater than or equal to about 150 nm and less than or equal to about 250 nm.

5. The reactor cell of claim 1, wherein the substrate is crystalline and the epitaxial layer is also crystalline.

6. The reactor cell of claim 1, further comprising at least one port in fluid communication with a liquid metal delivery system that delivers liquid metal to the liquid metal electrode.

7. The reactor cell of claim 1, wherein the porous membrane has edge regions that are hydrophobic and a central region that is hydrophilic to permit fluid communication between the liquid electrolyte and the liquid metal electrode.

8. The reactor cell of claim 1, further comprising a plate disposed between the porous membrane and the substrate, wherein the plate comprises one or more open regions that define the liquid metal electrode.

9. The reactor cell of claim 1, wherein the semiconductor element is selected from the group consisting of silicon, germanium, carbon, and combinations thereof.

* * * * *

UNITED STATES PATENT AND TRADEMARK OFFICE
CERTIFICATE OF CORRECTION

PATENT NO. : 10,538,860 B2
APPLICATION NO. : 15/865432
DATED : January 21, 2020
INVENTOR(S) : Stephen Maldonado et al.

Page 1 of 1

It is certified that error appears in the above-identified patent and that said Letters Patent is hereby corrected as shown below:

On the Title Page

At Column 1 (73) Assignee, Line number 3, delete "Arbot" and insert --Arbor--.

Signed and Sealed this
Thirty-first Day of March, 2020

Andrei Iancu
*Director of the United States Patent and Trademark Office*